Figure 1A:
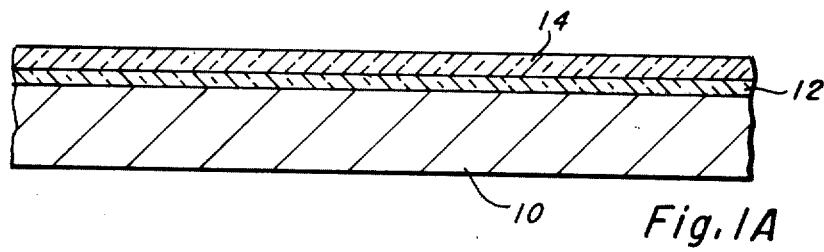

United States Patent [19]

Tasch, Jr.

[11] 4,024,563
[45] May 17, 1977

[54] DOPED OXIDE BURIED CHANNEL CHARGE-COUPLED DEVICE

[75] Inventor: Al F. Tasch, Jr., Richardson, Tex.

[73] Assignee: Texas Instruments Incorporated, Dallas, Tex.

[22] Filed: Sept. 2, 1975

[21] Appl. No.: 609,268

[52] U.S. Cl. .................................. 357/24; 357/91; 148/1.5; 148/187; 148/188

[51] Int. Cl.² ................ H01L 29/78; H01L 21/265

[58] Field of Search ................ 148/1.5, 187, 188; 357/24, 91

[56] References Cited

UNITED STATES PATENTS

| 3,704,178 | 11/1972 | Hill .............................. 148/188 X |
| 3,796,932 | 3/1974 | Amelio et al. ........................ 357/24 |
| 3,915,755 | 10/1975 | Goetzberger et al. ............. 148/1.5 |
| 3,918,997 | 11/1975 | Mohsen et al. ..................... 148/1.5 |
| 3,931,674 | 1/1976 | Amelio .............................. 357/91 X |
| 3,975,753 | 8/1976 | Bharat .............................. 357/24 |

OTHER PUBLICATIONS

Walden et al., *Bell System Technical Journal*, Sept. 1972, pp. 1635–1640.
Kim et al., *NEREM* 72, 1972, pp. 161–164.

Primary Examiner—G. Ozaki
Attorney, Agent, or Firm—Harold Levine; James T. Comfort; Leo N. Heiting

[57] ABSTRACT

Processes for manufacturing buried channel charge coupled devices (CCDs). After formation of an insulating layer at the surface of the CCD semiconductor substrate, a dopant material, suitable for the formation of the buried channel, is ion implanted into the insulating material. Subsequent diffusion steps cause the dopant to migrate into the underlying surface of the semiconductor substrate so as to define the buried channel region below the substrate surface.

6 Claims, 5 Drawing Figures

DOPED OXIDE BURIED CHANNEL CHARGE-COUPLED DEVICE

This invention relates to methods for fabricating charge coupled devices (CCDs), and more particularly to improved methods for the fabrication of buried channel CCDs.

Buried channel structures have become well known in the semiconductor art and were described by R. H. Walden et al in "The Buried Channel Charge Coupled Device," Bell System Technical Journal, September 1972. Briefly for purposes of description it may be assumed that such device is formed on a P-type silicon substrate, although buried channel CCDs on N-type substrate material are also known. In contrast with other types of CCDs, an N-type layer, preferably of 0.5 to several microns depth, is formed at the surface of the P-type substrate. As in the case of other types of CCDs, the substrate is covered with a thin layer of insulating material on which may be placed any of various types of electrode structures adapted to propagate signals along the CCD channel.

Buried channel CCDs have been shown to have high transfer efficiency and to be capable of operation at relatively high frequencies. In order to realize the high transfer efficiency at high frequencies, as mentioned above, it is desirable to have the buried channel relatively deep, i.e., at least 0.5 micron. In the past several methods have been employed for the formation of the buried channel. In one such method the N-type layer is epitaxially grown on the underlying P-type substrate, thereby defining the channel at the interface between the P-type substrate and the overlying N-type layer. A problem with this method, however, stems from the fact that the epitaxial material typically has a relatively shorter bulk lifetime. As a result, devices with an epitaxially grown layer exhibit a relatively high dark current. A second known method for formation of the buried channel is to ion implant suitable dopants directly into the surface of the P-type CCD substrate. This method is somewhat limited, however, in that very high energies are required to implant ions to a depth of a few microns. Additionally there exists the possibility that the ion implantation will produce irreversible bulk lifetime degradation in the semiconductor material, again resulting in excessively large dark currents.

It is therefore an object of the present invention to provide improved processes for fabricating buried channel CCD structures.

It is another object of the invention to provide improved processes for fabricating such CCD structures which result in a buried channel of suitable depth.

It is a further object of the invention to provide a method for fabricating buried channel CCDs wherein the method does not introduce excessive bulk lifetime degradation in the CCD semi-conductor material.

It is yet another object of the invention to provide a method for fabricating buried channel CCDs, the method including the use of an ion implantation source, but wherein excessively high energies are not required for the ion implantation.

It is still a further object of the invention to provide an improved method for the formation of the buried channel in a buried channel CCD and wherein the improved method is compatible with knwon methods for fabricating the remainder of the CCD.

In one aspect of the invention, by way of example, the CCD may be formed on a substrate of P-type silicon. A thin insulating layer, preferably of thermally grown silicon dioxide, is formed at the surface of the substrate. A suitable N-type dopant is next ion implanted into the structure. The energy employed in the ion implantation source is selected to ensure that the peak of the distribution of implanted ions occurs within the thin insulating layer. While a small fraction of the implanted ions will have penetrated into the underlying semiconductor substrate material, the majority of the implanted ions will at this point reside within the insulating layer. This ion implantation is accomplished with relatively low source energy and results in very little damage, if any, to the substrate material. Subsequently, the insulating layer is removed from the surface of the substrate except in the region where the CCD is to be located, and in particular the buried channel region remains covered by insulating material. The dopant ions, which at this point are located almost entirely within the thin insulating layer, are caused to migrate into the upper portion of the semiconductor substrate by means of a high temperature diffusion process. In most cases it is not necessary to perform a specific diffusion for this purpose, the diffusion of the N-type ions into the semiconductor surface occurring as a by-product of other furnace operations performed in the fabrication of the CCD. Such other furnace operations, for example, might typically include diffusions performed for the purpose of forming channel stop regions and forming the input and output structures of the CCD. During these furnace operations the N-type dopant ions will diffuse from the insulating layer into the semiconductor substrate to the desired depth of at least 0.5 microns.

In another aspect of the invention, the step of introducing dopant ions into the insulating layer by means of ion implantation is performed at a later point in the fabrication process of the CCD. In this aspect of the invention, several diffusions are performed on the structure prior to the introduction of the dopant into the insulating layer. These diffusions as mentioned above, may include formation of channel stop regions and the input and output structures of the CCD. After these diffusions, the dopant ions are implanted into the insulating layer and a subsequent high temperature diffusion step causes the ions to migrate into the buried channel region of the upper surface of the substrate.

Other features and objects of the invention will be made apparent by a consideration of the following detailed description along with the attached drawings wherein:

FIGS. 1A–1E illustrate various steps in the improved process for fabricating a buried channel CCD.

In each of the embodiments of the invention to be described, the CCD includes a channel region defined in a semiconductor substrate. The channel is peripherally bounded by channel stop regions and includes appropriate structure for inputting signals, in the form of charge packets, into the channel beneath one or more selected phase electrodes. These charge packets are propagated along the channel by suitable clock pulses applied to phase electrodes located above the channel and insulated from the semiconductor surface, the charge packets being extracted as output signals by suitable output structure. As thus far described, the CCD structure and method of fabricating it are known in the art and, since they do not form part of the present invention, will be further described only insofar as they relate to formation of the buried channel.

It will be assumed that the semiconductor material is silicon, and that an N-channel (P-substrate) CCD is being fabricated. However, it is to be appreciated that the concept of the invention is applicable also to fabrication of P-channel (N-substrate) CCD structures as well as to CCD structures utilizing other semiconductor materials, for example, germanium and gallium arsenide.

Referring to FIG. 1, there are shown several sectional views of a CCD structure depicting the structure as it appears in various stages of the fabrication process. With particular reference to FIG. 1A, there is depicted a P-type silicon substrate 10 on the upper surface of which is located a thin insulating layer 12. Insulating layer 12 may be thermally grown on silicon substrate 10 at a temperature in the range of 900°–1100° C and in the preferred embodiment comprises a layer of silicon dioxide having a thickness in the range 400–1000A. Insulating layer 12 is grown to have a uniform thickness over the channel portion of the CCD structure illustrated in FIG. 1A.

After growth of insulating layer 12, a layer of silicon nitride 14 (1000–2000 A) is deposited over the silicon dioxide. This deposition is accomplished at a temperature range of approximately 700°–1000° C. In the preferred method of the invention however, prior to deposition of silicon nitride layer 14, a suitable dopant material is implanted in insulating layer 12. In the case illustrated where substrate 10 is comprised of a P-type semiconductor material, N-type dopant ions, preferably phosphorous, are implanted into silicon dioxide layer 12. It is of utmost importance to control the beam energy of the ion implantation source so as to ensure that the majority of the ions are implanted in silicon dioxide layer 12 and do not appreciably penetrate at this point in the process into the material of substrate 10. In this way, damage to the semiconductor material of substrate 10 resulting from the ion implantation process is minimized. If silicon dioxide layer 12 is 1000 A thick and a phosphorous dopant is employed, a beam energy of 40–70 kev and a dosage of $1-3\times10^{12}$cm$^{-2}$ may be used. After implantation, the dopant ions may be caused to migrate into the upper surface of substrate 10 by a special diffusion step, or alternatively, as will be described below in the preferred method of the invention, this migration occurs as a by-product of other high temperature steps performed in the fabrication of the CCD.

While, as has been described above, the ion implantation is preferably performed prior to formation of silicon nitride layer 14, it is also possible to perform the ion implantation after silicon nitride layer 14 has been deposited. This latter procedure involves the disadvantage of requiring higher beam energy for the ion implantation source. Additionally, the approximately gaussian distribution of ions as a function of depth in the structure, is broader when the ions are implanted through silicon nitride layer 14 than when they are implanted directly into silicon dioxide layer 12. As a result, when the ions are implanted through silicon nitride layer 14, it is more difficult to ensure that the peak of the gaussian distribution occurs in the silicon dioxide layer 12, but near the upper surface of substrate 10.

Figure 1B:
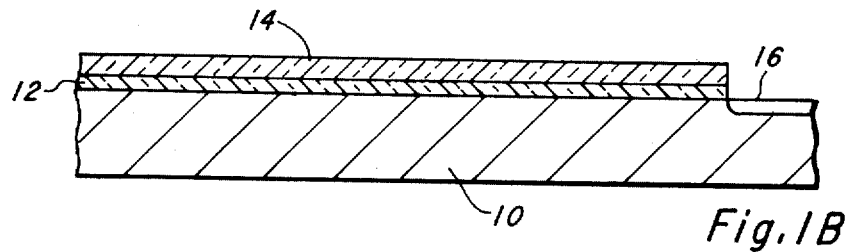

With reference to FIG. 1B, the silicon nitride layer 14 and silicon dioxide layer 12 are next patterned, using conventional photolithographic and etching techniques, to expose a region 16 at the surface of substrate 10 where a channel stop diffusion is to be performed. The etching of the silicon nitride is executed by an RF plasma etch, which uses a gas consisting of CF$_4$ and around 5–15% oxygen. This etches the silicon nitride at a much faster rate than that for the photoresist and silicon dioxide. Alternatively, the patterning of the silicon nitride can be accomplished by depositing a layer of silicon dioxide or thermally converting the top portion of the silicon nitride to silicon dioxide, patterning the silicon dioxide, and then etching the silicon nitride with a wet etchant, such as hot phosphoric acid. In this case the silicon dioxide serves as an etch mask. In either case, after etching of the silicon nitride, the underlying silicon dioxide layer in region 16 is etched, as is well known in the art, with a buffered HF solution.

Figure 1C:
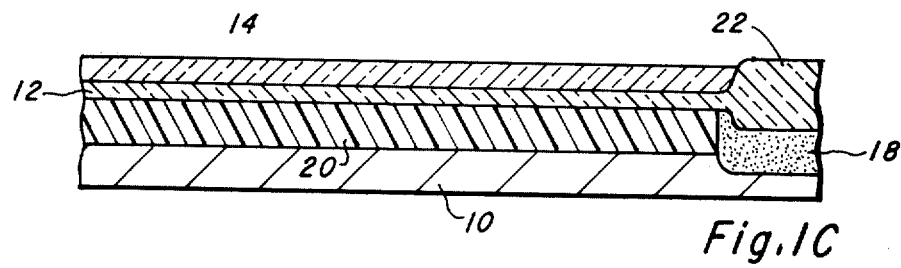

After exposure of region 16 on substrate 10, the channel stop deposition is performed using a suitable P-type dopant such as boron. This is followed by a high temperature oxidation stop to grow the field (thick) oxide to a thickness of about one micron as illustrated in FIG. 1C at 22. This oxidation step also causes the boron dopant to diffuse deeply into substrate 10 thereby forming the P+ channel stop region 18. The channel stop region would, for example, define the periphery of the CCD structure, only a portion of the channel stop region being shown in FIG. 1C. The filed oxide along with the channel stop diffusion provides the desired electrical isolation between the CCD and other areas on the slice. As illustrated in FIG. 1C, the high temperatures required for the field oxidation and channel stop diffusion also result in diffusion of the phosphorous dopant from silicon dioxide layer 12 into the upper surface of substrate 10, thereby forming N-type layer 20. It will be appreciated that in the preferred method wherein the phosphorous ions are implanted prior to formation of silicon nitride layer 14, the temperatures associated with deposition of the silicon nitride layer may already have initiated to some extent the diffusion of the phosphorous dopant into substrate 10.

Next, with reference to FIG. 1D, again using conventional photolithographic and etching techniques, a region 24 on the surface of substrate 10 is exposed. After exposing area 24 a diffusion of a suitable N-type dopant such as phosphorous or arsenic is performed to form an N+ region 26 which comprises a portion of the output diode of the CCD. While not shown expressly in FIG. 1, in some cases a similar operation will be performed at the input end of the CCD for the purpose of providing an input diode structure. The high temperatures required for the formation of N+ region 26 further contribute to deepening of the layer 20.

Figure 1D:
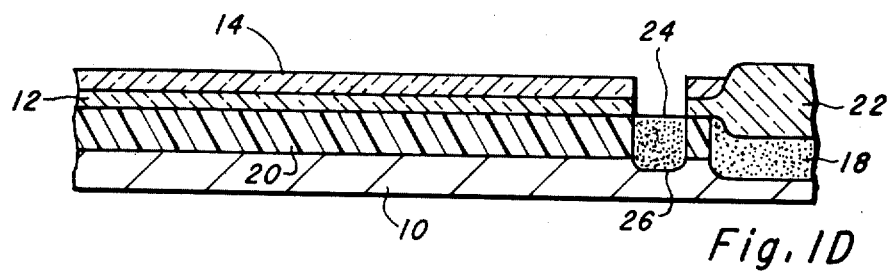
Figure 1E:
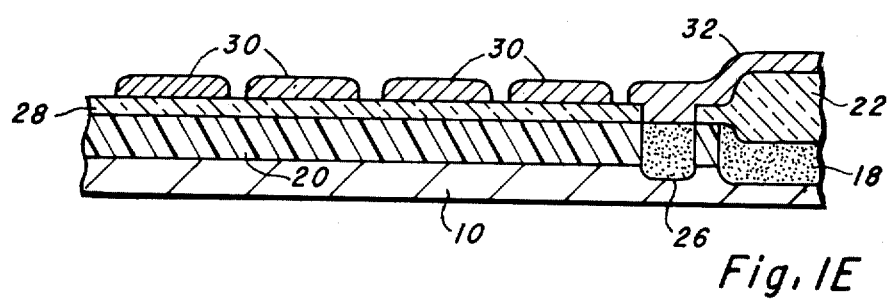

At this point the remaining portions of silicon nitride layer 14 are stripped away using a wet etchant, such as hot phosphoric acid. This is followed by removal of silicon dioxide layer 12 and re-oxidization of the gate area for the purpose of forming a new high quality silicon dioxide layer 28 as is illustrated in FIG. 1E. New silicon dioxide layer 28 is then patterned in a photolithographic and etch step to provide an opening to N+ region 26.

At this point a thin layer of a suitable metal such as aluminum is deposited on the upper surface of the structure. This metallic layer is patterned photolithographically and etched to form a plurality of CCD phase electrodes 30 extending laterally across the channel region as well as a contact 32 for the output diode. Again it will be understood that a similar contact structure may also be provided at the input end of the CCD. While the electrode structure illustrated in FIG. 1E is single level and may typically be operated in a conventional three-phase mode of operation, it is to be understood that the invention is not so limited. By way of example, it is noted that the invention may be combined with a new process for manufacturing two phase CCDs as is disclosed in a copending U.S. patent application Ser. No. 598,316, filed July 23, 1975, entitled "IMPROVED SILICON GATE CCD STRUCTURE" also assigned to the assignee of the present invention.

Fabrication in accordance with the principles of the present invention results in a substantially improved buried channel CCD structure. Implantation of the dopant ions into the silicon dioxide layer followed by diffusion of the dopant into the upper surface of the substrate results in very little damage, if any, to the substrate material. It follows that the dark currents occurring in the present device are significantly lower than those observed in buried channel CCDs wherein the ions are implanted directly into the substrate material or wherein the overlying layer is epitaxially grown. As a further advantage, the beam energies required to implant ions in the silicon dioxide layer are mardkedly lower than those required to implant the dopant ions directly into the substrate material.

Further, as is evidenced by the disclosure above, the fabrication steps required for formation of the overlying layer are readily combined with known processes for fabricating the remainder of the CCD structure. In particular it is noted that the diffusion of the dopant ions to the desired depth in the substrate material, comes about as a natural by-product of other diffusion steps employed in the fabrication of the CCD.

While the preferred method of practicing the invention has been disclosed, it is to be understood that the doping of the silicon dioxide layer followed by diffusion of the dopant ions into the upper surface of the CCD substrate may be accomplished at alternative points in the device fabrication. One such alternative may be described as follows. With particular reference to FIG. 1D it will be recalled that after the N+ diffusion used to form output diode 26, the remaining portions of silicon nitride layer 14 are stripped off of the structure. With silicon dioxide layer 12 thus exposed, the dopant ions may be implanted into the oxide at this point in the process. A diffusion step can then be performed for the specific purpose of driving the dopant ions into the upper surface of substrate 10. After this diffusion, the old silicon dioxide layer 12 is removed and the gate re-oxidized to provide new silicon dioxide layer 28. The remainder of the process continues in the manner previously described.

In this alternative method of practicing the invention, it may be noted that during the implantation of ions into silicon dioxide layer 12, there will also occur some implantation into the surface of N+ doped region 26. The N-type dopant so implanted, however, is completely overwhelmed by the much higher density of N-type dopant, which was used in forming the N+ doped output diode 26. The addition of a few N-type ions therefore, is of no consequence as regards the operation of the CCD.

Whereas there have been disclosed several embodiments of the invention, there may be suggested to those skilled in the art other minor modifications which do not depart from the spirit and scope of the invention as set forth in the following claims.

What is claimed is:
1. A buried channel charge coupled device produced by the steps of:
    a. forming a thin layer of insulating material at the surface of a semiconductor substrate,
    b. implanting dopant ions into said layer of insulating material while controlling the energy of the ion implantation source to ensure that the peak of the distribution of dopant ions occurs in said thin layer of insulating material,
    c. heating the insulated semiconductor substrate to cause dopant ions to diffuse from said thin layer of insulating material into the material of said semiconductor substrate thereby forming said buried channel
    d. stripping said thin insulating layer overlying said buried layer and forming a clean thin layer of insulating material over said buried layer, said clean thin layer being surrounded by a thicker region of insulating material; and
    e. forming a plurality of phase electrodes above and insulated from said buried channel.
2. A method of fabricating a buried channel charge coupled device including steps of:
    a. forming a thin layer of uniform thickness insulating material on one surface of a semiconductor substrate of one conductivity type;
    b. forming a stop region including a thicker region of said insulating material defining the periphery of a channel region for said charge coupled device overlaid by said thin layer of insulating material;
    c. after one of steps (a) and (b) implanting dopant ions of opposite conductivity type into said thin layer of insulating material while controlling the energy of the ion implantation source to ensure that the peak of the distribution of dopant ions occurs in said thin layer of insulating material, and thereafter heating of said substrate to cause dopant ions to diffuse from said thin layer of insulating material into the underlying material of said semiconductor substrate to a substantially uniform depth along the length of said channel region thereby forming said buried channel;
    d. removing said thin insulating layer overlying the channel region and forming a clean thin layer of insulating material on said buried channel region; and
    e. forming a series of phase electrodes along the channel region on and insulated from the buried channel region by said clean thin layer of insulating material.
3. A method according to claim 2, wherein (i) said step (c) is performed between said steps (a) and (b);
    ii. the step of forming said stop region further includes forming a region in said semiconductor substrate below said thicker region of said insulating material having the same conductivity type as and higher dopant concentration than said substrate; and
    iii. said steps (b) and (d) effect the heating of said substrate to cause diffusion of said dopant ions from said thin layer of insulating material to form said buried channel region.
4. A method according to claim 2 wherein said semiconductor substrate is a silicon substrate, and said insulating material is silicon dioxide.

5. A method according to claim 4 wherein said layer of insulating material is thermally grown on the surface of said semiconductor substrate.

6. A method according to claim 4 including the additional step of, prior to said step of implanting dopant ions, depositing a layer of silicon nitride over the layer of silicon dioxide.

* * * * *